United States Patent
Rinerson et al.

(10) Patent No.: US 6,940,744 B2
(45) Date of Patent: Sep. 6, 2005

(54) ADAPTIVE PROGRAMMING TECHNIQUE FOR A RE-WRITABLE CONDUCTIVE MEMORY DEVICE

(75) Inventors: Darrell Rinerson, Cupertino, CA (US); Christophe J. Chevallier, Palo Alto, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 10/680,508

(22) Filed: Oct. 6, 2003

(65) Prior Publication Data

US 2004/0160798 A1 Aug. 19, 2004

Related U.S. Application Data

(60) Provisional application No. 60/422,922, filed on Oct. 31, 2002, and provisional application No. 60/424,083, filed on Nov. 5, 2002.

(51) Int. Cl.[7] .............................................. G11C 11/00
(52) U.S. Cl. .................. 365/148; 365/158; 365/189.07
(58) Field of Search ................................. 365/148, 158, 365/157, 159, 100, 210, 189.07

(56) References Cited

U.S. PATENT DOCUMENTS

| | | | | |
|---|---|---|---|---|
| 5,287,326 A | | 2/1994 | Hirata | 365/203.03 |
| 5,422,842 A | | 6/1995 | Cernea et al. | 365/185.22 |
| 5,495,442 A | | 2/1996 | Cernea et al. | 365/185.03 |
| 5,532,964 A | | 7/1996 | Cernea et al. | 365/189.09 |
| 6,204,139 B1 | | 3/2001 | Liu et al. | 438/385 |
| 6,324,093 B1 | * | 11/2001 | Perner et al. | 365/171 |
| 6,515,904 B2 | * | 2/2003 | Moore et al. | 365/185.19 |
| 6,574,145 B2 | | 6/2003 | Kleveland et al. | 365/185.19 |
| 6,753,561 B1 | * | 6/2004 | Rinerson et al. | 257/295 |
| 6,798,685 B2 | * | 9/2004 | Rinerson et al. | 365/100 |
| 6,807,088 B2 | * | 10/2004 | Tsuchida | 365/158 |
| 6,809,976 B2 | * | 10/2004 | Ooishi | 365/210 |
| 6,831,854 B2 | * | 12/2004 | Rinerson et al. | 365/158 |
| 6,834,008 B2 | * | 12/2004 | Rinerson et al. | 365/158 |
| 6,836,421 B2 | * | 12/2004 | Rinerson et al. | 365/51 |
| 6,850,429 B2 | * | 2/2005 | Rinerson et al. | 365/158 |
| 6,850,455 B2 | * | 2/2005 | Rinerson et al. | 365/230.02 |
| 6,856,536 B2 | * | 2/2005 | Rinerson et al. | 365/148 |
| 6,859,382 B2 | * | 2/2005 | Rinerson et al. | 365/148 |
| 6,870,755 B2 | * | 3/2005 | Rinerson et al. | 365/148 |

OTHER PUBLICATIONS

Beck, A. et al., "Reproducible switching effect in thin oxide films for memory applications," Applied Physics Letters, vol. 77, No. 1, Jul. 3, 2000, 139–141.

Rossel, C. et al., "Electrical current distribution across a metal–insulator–metal structure during bistable switching," Journal of Applied Physics, vol. 90, No. 6, Sep. 15, 2001, 2892–2898.

Watanabe, Y. et al., "Current–driven insulator–conductor transistion and nonvolatile memory in chromium–doped $SrTiO_3$ single crystals ," Applied Physics Letters, vol. 78, No. 23, Jun. 4, 2001, 3738–3740.

Liu, S.Q., et al., "Electric–pulse–induced reversible resistance change effect in magnetoresistive films", Applied Physics Letters, vol. 76, No. 19, May 8, 2000, 2749–2651.

Liu, S.Q., et al., "A New Concept For Non–Volatile Memory: Electric–Pulse Induced Reversible Resistance Change Effect In Magnetoresistive Films", Space Vacuum Epitaxy Center, University of Huston, Huston TX, 7 Pages.

* cited by examiner

Primary Examiner—Gene N. Auduong

(57) ABSTRACT

A programming circuit is provided. As a conductive memory cell is programmed, its resistance changes. The provided programming circuit monitors the changing resistance while programming the memory cell. The programming circuit can be used to only program the memory cell for as long as programming is actually needed. Additionally, the programming circuit can be used to only program the memory cell when it has a value that needs to be changed.

37 Claims, 9 Drawing Sheets

ADAPTIVE PROGRAMMING TECHNIQUE FOR A RE-WRITABLE CONDUCTIVE MEMORY DEVICE

CROSS REFERENCE TO RELATED APPLICATION

This application claims the benefit of U.S. Provisional Application No. 60/422,922, filed Oct. 31, 2002, and the U.S. Provisional Application No. 60/424,083, filed Nov. 5, 2002, all of which are incorporated herein by reference in their entireties and for all purposes. This application is related to the following U.S. Patent Applications: U.S. application Ser. No. 10/360,005, filed Feb. 7, 2003; U.S. application Ser. No. 10/330,512, filed Dec. 26, 2002; application Ser. No. 10/330,153, filed Dec. 26, 2002; application Ser. No. 10/330,964, filed Dec. 26, 2002; application Ser. No. 10/330,170, filed Dec. 26, 2002; application Ser. No. 10/330,900, filed Dec. 26, 2002; application Ser. No. 10/330,150, filed Dec. 26, 2002; application Ser. No. 10/330,965, filed Dec. 26, 2002; application Ser. No. 10/249,846, filed May 12, 2003; application Ser. No. 10/249,848, filed May 12, 2003; application Ser. No. 10/612,733, filed Jul. 1, 2003; application Ser. No. 10/613,099, filed Jul. 1, 2003; application Ser. No. 10/612,191, filed Jul. 1, 2003; application Ser. No. 10/612,263, filed Jul. 1, 2003; application Ser. No. 10/612,776, filed Jul. 1, 2003; application Ser. No. 10/604,556, filed Jul. 30, 2003; application Ser. No. 10/604,606, filed Aug. 4, 2003; and application Ser. No. 10/634,636, filed Aug. 4, 2003. All of the above applications are hereby incorporated herein by reference in their entireties and for all purposes.

BACKGROUND OF THE INVENTION

1. Field of the Invention

This invention concerns the general field of memory devices. More specifically, the present invention is directed to write circuitry.

2. Description of the Related Art

A random access memory ("RAM") type of memory is typically associated with the main memory available to computer programs and similar devices. RAM memory is often contrasted with a read-only memory ("ROM") type of memory, which is typically associated with a special memory that is either not changed, or changed relatively infrequently. RAM mostly includes SRAM and DRAM. ROM mostly includes Flash memory, EPROM, OTP, EEPROM, PROM and ROM. Some devices such as NovRAM and Battery powered SRAM are hybrid devices using more than one technology.

Although SRAM, with very fast access times, is the memory of choice for computer applications, its volatility, large size and stand-by current limit the total size and applications of the memory. Non-volatile memories such as Flash memory are slower to program, and in some cases must erase a large block of memory before being reprogrammed. DRAM has the smallest cell size, but necessitates a complex refresh algorithm, and is volatile. For new applications, away from PC applications and into portable applications such as cell phones, personal digital assistants (PDA), digital cameras, camcorders, removable "key-chain" or "USB" disks, the key issues are nonvolatility and low power consumption.

Regardless of how the memory is used, RAM and ROM overlap in many respects. Both types of memory can allow random access reads. Both types of memory can be relatively fast or relatively slow. Although all ROMs are non-volatile, so are some RAMs. Although most ROMs cannot change their data once programmed, some ROMs can be re-programmed. The only consistent difference between RAM and ROM is that ROM is always non-volatile and RAM is always re-writable.

The ROMs that are capable of modifying their data typically require long write cycles that erase entire blocks of data prior to new data being written. For example, UV light might be applied to an entire memory block in order to "repair" fused connections so that the block can be re-written with new data. RAM, on the other hand, can read or write to a randomly accessed byte of memory, typically performing either operation in a standard cycle.

Conventional nonvolatile RAM and ROM requires three terminal MOSFET-based devices. The layout of such devices are not ideal, usually requiring feature sizes of at least 8f2 for each memory cell, where f is the minimum feature size.

However, not all memory elements require three terminals. Certain conductive metal oxides (CMOs), for example, can retain a resistive state after being exposed to an electronic pulse, which can be generated from two terminals. U.S. Pat. No. 6,204,139, issued Mar. 20, 2001, to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

Similarly, the IBM Zurich Research Center has also published three technical papers that also discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped SrTiO3 single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

Similarly, magnetic RAM (MRAM) requires only two terminals to deliver a magnetic field to the memory element. Other two terminal devices include Ovonic Unified Memory (OUM), which uses chalcogenic layers of material, and various types of ferroelectric memory. With only two terminals, it has been theorized that memory can be arranged in a cross point architecture.

However, mere recognition that a two terminal memory element is theoretically capable of being placed in a cross point array does not solve many of the non-trivial problems associated with actually using such a device.

For example, as memory is scaled, bit-to-bit variations increase. The size variations of critical layers affect cells that are at minimum dimensions, i.e., at the limit of the lithography capabilities. The variations may results in memory bits with different programming time, and possibly different write thresholds.

The standard way to deal with program time difference, as used with EPROM and Flash memories, consists of an algorithm that first writes data by applying an appropriate combination of voltages or current to the selected cells, then verifies data by comparing the data read from the selected cells to the data expected to be programmed, and then, if the data is not properly programmed, write the data again. The process is repeated until the data is correct. If the data does not verify properly after a pre-determined number of retries, the memory issues a fail diagnostic.

The problem with the above approach is that it is slow, as the memory circuit has to switch back and forth numerous times between read and write modes. Hence, the present invention is directed to electronic systems interfacing with the re-writable conductive memory device, inter alias, to circumvent this problem.

SUMMARY OF THE INVENTION

The present invention provides a program circuit that can be used to program a selected memory cell. Memory cells are selected out of a memory array in order to write a specific value to a memory device. Each memory cell has a resistance that is capable of representing stored information. The program circuit receives a selected cell input from the selected memory cell and a first reference input, which are used by a comparator. The comparator is capable of producing a first comparator output that is a function of the selected cell input and the first reference input. In some aspects of the invention, the comparator output causes the program circuit to cease programming when the selected cell input equals the first reference input.

In another aspect of the invention, an adaptive programming circuit includes a detector, a controller and a driver. The detector detects the resistance of a memory device, $R_d$. The controller is coupled to the detector and both receive a write command and, based upon the detector's output, the controller generates an activating signal indicating either an activated or a deactivated state. When the activating signal is in the activated state, the driver drives the re-writable conductive memory device such that the resistance of the conductive memory device is modified to a target resistance, $R_t$, whereby the $R_t$ is already equal to $R_d$ when the activating signal is in the deactivated state while the programming circuit is enabled.

In yet another aspect of the invention, a self terminating programming process for programming a voltage switchable re-writable conductive memory device of resistance $R_d$, is disclosed. First, a write command for a target resistance $R_t$ is received. Then, a reference current is selected, the selection being dependent upon $R_t$. Also, a memory cell current is detected, the memory cell current being based upon $R_d$. The selected reference current is then compared with the memory cell current. A write voltage is then applied across the memory cell for as long as the comparison indicates that $R_t$ is not equal to $R_d$. Once $R_t$ is equal to $R_d$ the programming cycle is terminated.

In yet another aspect of the invention, a program circuit for a programming a selected cell to a desired resistive state receives a first reference input, a second reference input, and a selected cell input. The program circuit includes a first comparator, a second comparator, a first driver and a second driver. The first driver's activation is at least partially dependent upon the first comparator output, which is a function of the first reference input and the selected cell input. Similarly, the second driver's activation is at least partially dependent upon the second comparator output, which is a function of the second reference input and the selected cell input.

It yet another aspect of the invention, a program circuit for a programming a selected cell to a desired resistive state receives a reference level and a selected cell level. The program circuit includes a comparator, a first driver, and a second driver. The first driver can provide a voltage capable of increasing the resistance of the selected cell and the second driver can provide a voltage capable of decreasing the resistance of the selected cell. Which of the drivers is activated is dependent upon the comparator output and the desired resistive state.

BRIEF DESCRIPTION OF DRAWINGS

The current invention will be better understood and the nature of the invention set forth above will become apparent when consideration is given to the following detailed description of the preferred embodiments. For clarity of explanation, the detailed description further makes reference to the attached drawings herein.

It is to be understood that, in the drawings, like reference numerals designate like structural elements. Also, it should be understood that the depictions in the figures are not necessarily to scale.

Glossary

As used in the present specification, the following words and phrases are generally intended to have the meanings as set forth below, except to the extent that the context in which they are used indicates otherwise. The following abbreviations and terms have the indicated meanings throughout:

The term "array" refers to a plurality of objects arranged in a regular pattern.

The term "CMO" refers to a conductive metal oxide

The term "cross point memory array" refers to an array with two sets of generally perpendicular lines with memory cells placed at the intersections between the sets of lines The term "Memory Cell" refers to a spatially repeatable set of devices each storing a unit of addressable information, for example one bit The term "Memory Material" refers to a material that is capable of storing information The term "Memory Plug" refers to various layers of materials arranged between conductive lines and including at least a memory material and typically including a top electrode and a bottom electrode

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well-known methods, procedures, materials, components and circuitry have not been described in detail to avoid unnecessary obscuring aspects of the present invention. The detailed description is presented largely in terms of simplified semiconductor device terminal I–V characteristics, circuit block diagrams, circuit schematics and timing diagrams. These descriptions and representations are the means used by those experienced or skilled in the art to concisely and most effectively convey the substance of their work to others skilled in the art.

Figure 1:
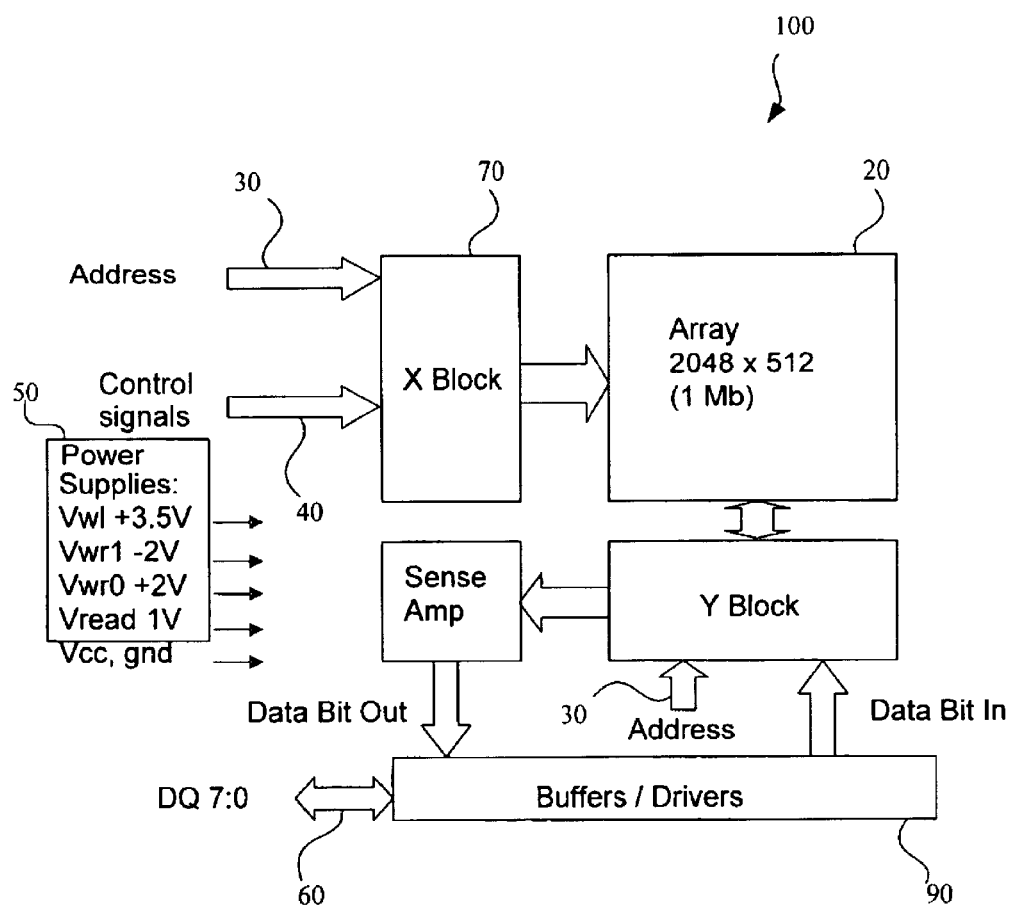
FIG. 1 depicts a block diagram of a re-writable memory array.

FIG. 1 depicts one implementation of a block diagram of a memory system 100. The memory system 100, typically implemented on an integrated circuit chip, includes a re-writable memory array 20. Some inputs to the re-writable memory array 20 include an address bus 30, a control bus 40 and some power supplies 50. Input/output signals form a data bus 60. The control bus 40 includes signals to select the chip, to indicate whether a read or write operation is to be performed, and to enable output buffers within a buffers and drivers block 90 when the chip is in a read operation mode. The address bus 30 specifies which location within the re-writable memory array 20 is to be accessed. Some address lines of the address bus 30 go to an X block 70, which includes a predecoder and an X-decoder to select one of the horizontal array lines addressing the re-writable memory array 20. Likewise, some address lines of the address bus 30 go to a Y block 80, which includes a predecoder and a Y-decoder to apply appropriate voltages on selected vertical lines. Typically 8 vertical lines are selected at once for the case of an 8-bit wide data bus, with each vertical line corresponding to one data line.

During a write operation (following a write command with write-data) write-data is applied through the data bus 60 to the buffers and drivers 90, and then to the selected vertical lines, also called bit lines. Meanwhile, the address on the address bus 30 will select which memory cells, located at the intersection of a horizontal line selected by the X-decoder and those vertical lines selected by the Y-decoder, within the re-writable memory array 20 are being written.

Similarly, during a read operation, a horizontal line and a number of vertical lines are selected to read each unit of read-data, for example a byte. Meanwhile, within the buffers and drivers block 90, data drivers are disabled and sense amplifiers are enabled to detect the state of the selected memory cells with output signals from the selected memory cells, to amplify the output signals and send them to the output buffers which in turn will drive the output pins of the chip. The power supply block 50 is sometimes added, together with another control block, to generate some of the needed voltages internal to the chip.

While the above describes the essence of the operation of a memory system, in practice, many other circuits may be added to further enhance the memory functionality, manufacturing yield, testability and other features. However, these other circuits are not necessary for the understanding of the present invention to be presently described.

The re-writable memory array 20 itself is described in U.S. application Ser. No. 10/604,606 filed Aug. 4, 2003 already incorporated by reference.

Figure 2:
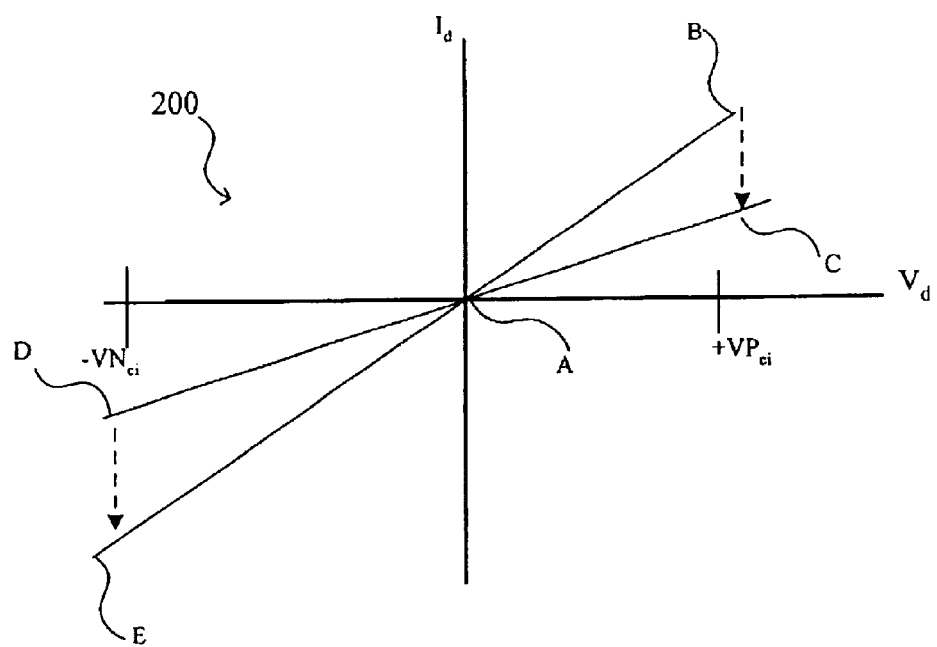
FIG. 2 depicts a composite current vs. voltage characteristics of a re-writable conductive memory device with two of its terminal resistance states superimposed.

The functionality of the re-writable conductive memory device, with a voltage switchable resistance $R_d$, is illustrated in FIG. 2 that depicts a composite I–V curve 200 of a re-writable conductive memory device with two of its terminal resistance states superimposed. It is remarked that, in general, the resistance $R_d$ is voltage switchable within a multi-level resistance set $R_j$ where j=(1,2, . . . ,M), with M>=2 and $R_1 < R_2 < \ldots < R_M$, and each value of $R_j$ thus representing a correspondingly stored data. Starting with Point A of drive voltage $V_d$=0 thus drive current $I_d$=0, within the region between Point A and Point B and characterized by:

$$0 <= V_d <= +VP_{ci}$$

$R_d=R_i$. However, once a threshold voltage $+VP_{ci}$ with an accompanying critical electric field strength is exceeded, for a duration of resistance switching time, within the re-writable conductive memory device the current flow changes to a generally lower value. This is indicated by Point C with a dashed pointing arrow. Now if $V_d$ is taken to a value that is more negative than $-VN_{ci}$ for a duration of resistance switching time, then the composite I–V curve 200 switches back from Point D to Point E as indicated by another dashed pointing arrow. Thus, in general, this functionality of $R_d$ switching can be expressed mathematically as follows:

$$R_d = R_j \text{ when } -VN_{cj} <= V_d <= +VP_{cj}; \text{ and}$$

$R_d$ switches to $R_{j+1}$ when $V_d$ goes above $+VP_{cj}$ followed by $R_d$ switching back to $R_j$ when $V_d$ drops below $-VN_{cj}$ where M>=2, j=(1, 2, . . . , M–1) and each of $VP_{cj}$ and $VN_{cj}$ is a pre-determined threshold voltage magnitude. Re-writable conductive memory device programming cycle time from about 0.1 ns to about 100 μs can be achieved. While a $V_d$ exceeding the threshold voltage would cause a corresponding resistance switching of the re-writable conductive memory device, a higher $V_d$ generally, by creating a correspondingly higher electric field within the device, would result in a shorter resistance switching time or equivalently a shorter device programming cycle time. Additionally, it is a good practice to insure that the drive voltage $V_d$ is set below a maximum allowable value $V_{max}$ above which unselected re-writable conductive memory device memory cells on a selected line within the memory array could be disturbed due to a parasitic coupling effect. Likewise, it is also a good practice to insure that the drive current $I_d$ is set below a maximum allowable value $I_{max}$ above which unselected re-writable conductive memory device memory cells on a selected line within the memory array could be disturbed due to the same parasitic coupling effect. It should be further noticed that although FIG. 2 shows linear IV characteristics, it is also possible for the memory cell to exhibit non-linear characteristics, as further described in U.S. application Ser. No. 10/604,556, already incorporated herein by reference for all purposes. Therefore, the terms "resistive memory" and "resistive device" also apply to memories and devices showing non-linear characteristics, and can also be referred to respectively as "conductive memory" and "conductive device".

As alluded to before, scaling down the re-writable conductive memory device size within a re-writable memory array for high memory density will, especially at the limit of lithographic capabilities, increase bit-to-bit tolerance of numerous device geometric, material and electrical parameters. This may result in memory cells exhibiting different programming cycle time and possibly different threshold voltage as well. To insure a reliable re-writable conductive memory device programming with a short programming cycle time despite these device parameter tolerances, the present invention proposes an adaptive programming technique for the re-writable conductive memory device.

Figure 3:
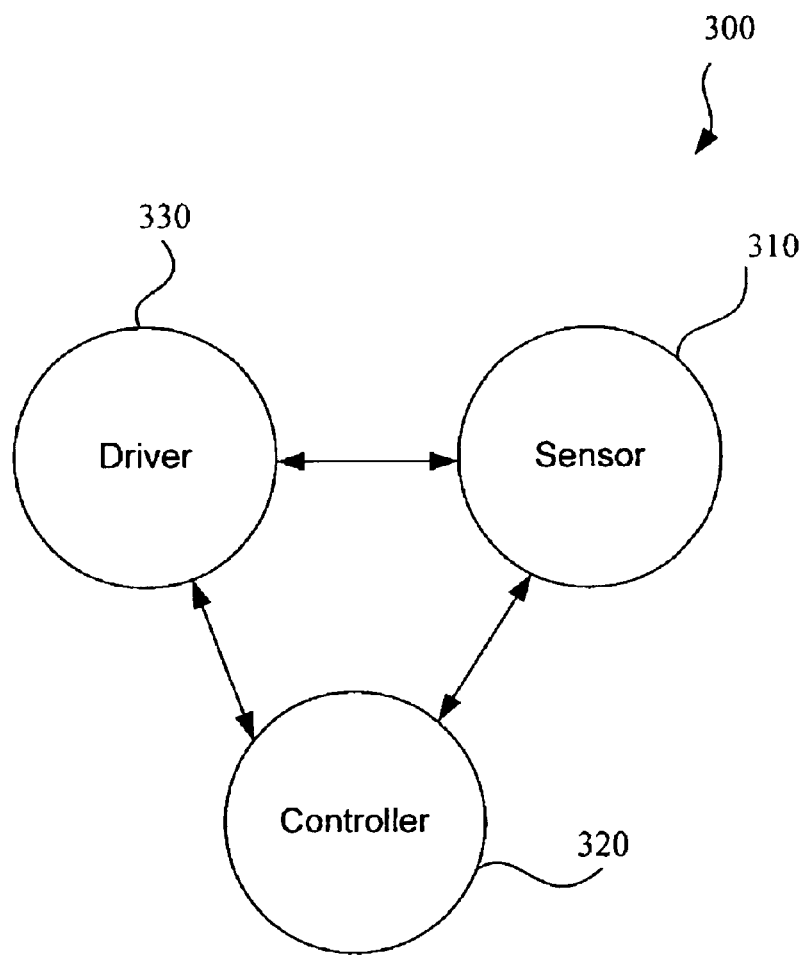
FIG. 3 depicts a high-level conceptual diagram of an adaptive programming circuit of the present invention.

A high-level conceptual diagram of an adaptive programming circuit of the present invention is depicted in FIG. 3. The adaptive programming circuit 300 includes a coupled detector 310, controller 320 and driver 330. The detector 310, being coupled to a re-writable conductive memory device, functions to detect $R_d$ and to output an indicating signal identifying an $R_j$ within the multi-level resistance set $(R_1, R_2, \ldots, R_M)$ that $R_d$ corresponds to. For those skilled in the art, the way to decide an $R_j$ within the multi-level resistance set that $R_d$ corresponds to is simply to determine, in a domain of resistance value of $R_d$, its closest neighbor out of the multi-level resistance set $(R_1, R_2, \ldots, R_M)$. The controller 320, being coupled to the detector 310, functions to detect a write command with write-data and the indicating signal and to generate an activating signal indicating either an activated or a deactivated state. The driver 330, being coupled to the re-writable conductive memory device and the controller 320, functions to drive, only while the activating signal is in the activated state, the re-writable conductive memory device to effect a desired switching of $R_d$ among the multi-level resistance set. The controller 320 can further include activating logic functions as follows:

(a) an absence of the write command (or the presence of a read command) sets the activating signal to a deactivated state thus insuring that the re-writable conductive memory device is not driven by the driver 330.

(b) a presence of the write command activates a comparison of the indicating signal with the write-data; and
  (b1) a non-correspondence between the indicating signal and the write-data sets the activating signal to an activated state while continuing function (b) thus causing the driver 330 to drive the re-writable conductive memory device to effect a desired switching of $R_d$ among the multi-level resistance set; or
  (b2) a correspondence between the indicating signal and the write-data sets the activating signal to a deactivated state and terminates the programming cycle.

Notice that logic element (b2) above, in addition to completing the adaptive aspect of the adaptive programming circuit 300, also functions to avoid a redundant programming cycle where $R_d$ already corresponds to the write-data before the programming cycle. Repetitive redundant programming cycles can potentially cause a shortening of the re-writable conductive memory device operating life.

To deal with re-writable conductive memory devices that either are unreasonably hard to program or would require an unreasonably long programming cycle time or simply have failed in time, the controller 320 can further include a pre-determined maximum allowable programming time $T_{max}$ and a timer tracking an elapsed time $T_{lp}$ of the programming cycle from the moment of presence of the write command. Correspondingly, the above activating logic is first modified to include a Logic Fault Signal (LFS) with, for example, LFS=1 means a fault condition and LFS=0 means a no-fault condition. Secondly, the activating logic adds, to function (b), a logic that sets LFS=1 if $T_{lp}>T_{max}$. Thirdly, the activating logic further includes the following changes:

1. logic element (a) includes an additional, unconditional initialization of LFS to 0.
2. logic element (b1) is replaced with the following two logic elements:
  (b11) a non-correspondence between the indicating signal and the write-data, while LFS=0, sets the activating signal to an activated state while continuing function (b) thus causing the driver 330 to drive the re-writable conductive memory device to effect a desired switching of $R_d$ among the multi-level resistance set; or
  (b12) a non-correspondence between the indicating signal and the write-data, but LFS=1, sets the activating signal to a deactivated state and terminates the programming cycle.

For simplicity of implementation in practice, to effect the function of detecting $R_d$ and outputting an indicating signal identifying an $R_j$ within the multi-level resistance set $(R_1, R_2, \ldots, R_M)$ that $R_d$ corresponds to, the detector 310 includes an equivalent-signal $S_{eq}$ generator, whose value corresponds to $R_d$ through a pre-determined function $R_d=f(S_{eq})$ follows:

$$R_1=f(S_{eq1}), R_2=f(S_{eq2}), \ldots \text{ and } R_M=f(S_{eqM}) \qquad (1)$$

The detector 310 further selects an equivalent-reference signal set $(REF_1, REF_2, \ldots, REF_M)$ depending upon the write data. A base reference signal will typically be an input to the memory system 100, or derived from resistive circuitry within the memory system 100. Additionally, the detector 310 compares $S_{eq}$ with an appropriate reference signal from the equivalent-reference signal set $(REF_1, REF_2, \ldots, REF_M)$.

For one example, the driver 330 is a switchable, by the activating signal, voltage source with an output voltage $V_{cs}$, the equivalent-signal $S_{eq}$ generator can be a current detector, coupled to the re-writable conductive memory device, providing the re-writable conductive memory device current $I_d$ as the equivalent-signal $S_{eq}$. That is $S_{eq}=I_d$. Consequently, the pre-determined function $R_d=f(S_{eq})$ can simply be $R_d=V_{cs}/I_d$ by Ohm's law. Where the output voltage $V_{cs}$ is a constant voltage, of course, its magnitude must exceed each respective threshold voltage $VP_{cj}$ and $VN_{cj}$ to effect a desired switching of $R_d$ among the multi-level resistance set. As a higher $V_d$ generally results in a shorter device programming cycle time, for those re-writable conductive memory devices having high threshold voltages $VP_{cj}$ and $VN_{cj}$, the $V_{cs}$ can be set as a time-varying voltage ramp of increasing magnitude so as to exceed each respective $VP_{cj}$ and $VN_{cj}$ within a pre-determined time interval to shorten the programming cycle time. Of course, the initial value of the time-varying voltage ramp can be set at or above a corresponding threshold voltage ($VP_{cj}$ or $VN_{cj}$) of the re-writable conductive memory device to further shorten the programming cycle time.

For another example, the driver 330 is a switchable, by the activating signal, current source with an output current $I_{cs}$ the equivalent-signal $S_{eq}$ generator can be a voltage detector, coupled to the re-writable conductive memory device, providing the re-writable conductive memory device voltage $V_d$ as the equivalent-signal $S_{eq}$. That is $S_{eq}=V_d$. Consequently, the pre-determined function $R_d=f(S_{eq})$ can be $R_d=V_d/I_{cs}$, also by Ohm's law. Where the output current $I_{cs}$ is a constant current, of course, its magnitude must cause the corresponding $V_d$ to exceed each respective threshold voltage $VP_{cj}$ and $VN_{cj}$ to effect a desired switching of $R_d$ among the multi-level resistance set. As a higher $V_d$ generally results in a shorter device programming cycle time, for those re-writable conductive memory devices having high threshold voltages $VP_{cj}$ and $VN_{cj}$, the $I_{cs}$ can be set as a time-varying current ramp of increasing magnitude so as to cause the corresponding $V_d$ to exceed each respective $VP_{cj}$ and $VN_{cj}$ within a pre-determined time interval to shorten the programming cycle time. Of course, the initial value of the time-varying current ramp can be set to cause the corresponding $V_d$ to be at or above a corresponding threshold voltage ($VP_{cj}$ or $VN_{cj}$) of the re-writable conductive memory device to further shorten the programming cycle time.

By now it should become clear that, in addition to being an adaptive programming circuit, the present invention is equally applicable to a method of programming the re-writable conductive memory device with a sequence of steps logically corresponding to the above attributes of the adaptive programming circuit. It should also be clear that, except for insuring that $V_d$ stays below each respective $VP_{cj}$ and $VN_{cj}$ to avoid the switching of $R_d$, essentially the same adaptive programming circuit can be adapted to effect a read operation outputting an indicating signal identifying an $R_j$ that $R_d$ corresponds to upon detection of a read-command. Additional, even more detailed embodiments of the detector 310, the controller 320 and the driver 330 will be presently illustrated graphically.

Figure 4A:
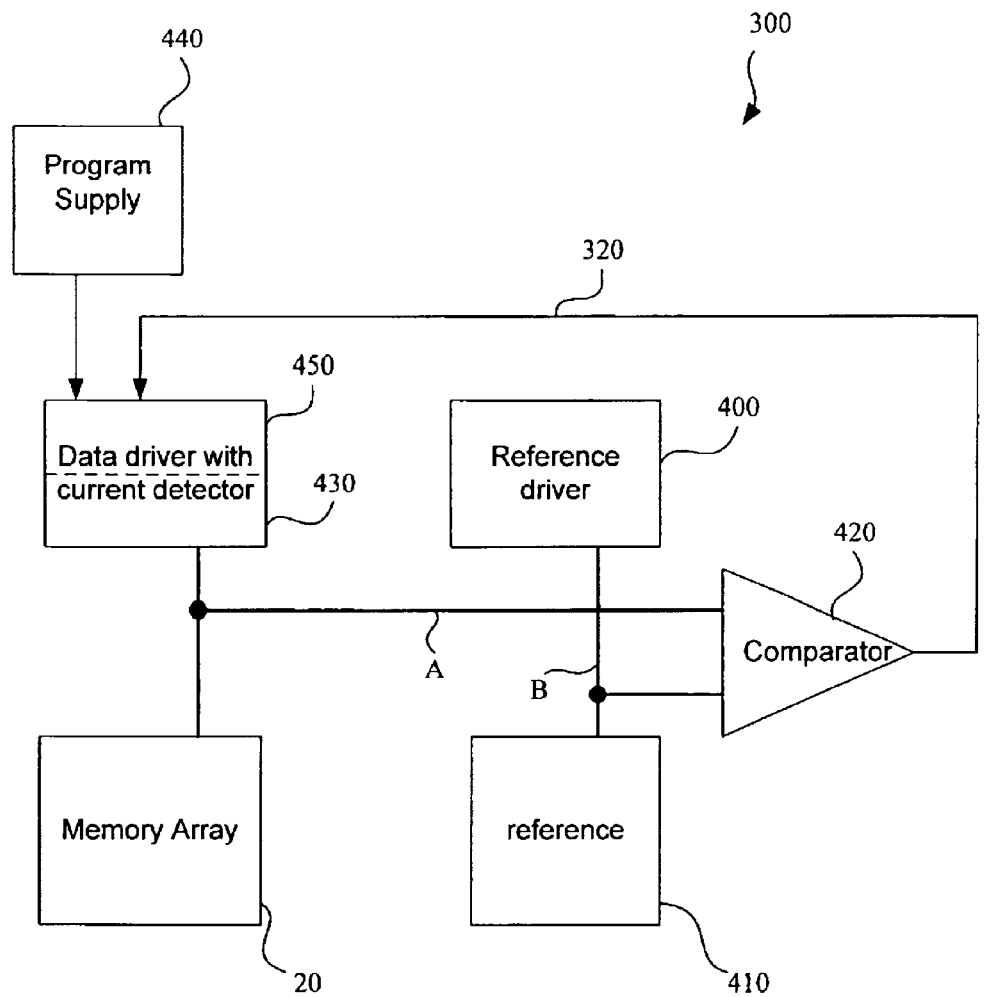
FIG. 4A depicts a first more detailed embodiment of the adaptive programming circuit using a comparator.

FIG. 4A depicts a first more detailed embodiment of the adaptive programming circuit 300 using a comparator. In this case the multi-level resistance set $R_j$ consists of only two distinct resistance levels $R_1 < R_2$, that is M=2. As part of the detector 310, the equivalent-reference signal set selector includes a reference driver 400 working in conjunction with a reference data source 410 to provide an equivalent-reference signal $REF_1$ at node B of a comparator 420. The driver 330 includes a program supply 440 and a data driver 450. The program supply 440 outputs, inter alia, write-data. The data driver 450 is a voltage source with an output voltage $V_{cs}$ for effecting an actual programming of the re-writable conductive memory device, located within a re-writable memory array 20, according to the write-data. The equivalent-signal $S_{eq}$ generator is a current detector 430, coupled to the re-writable conductive memory device, providing the equivalent-signal $S_{eq}=I_d$, at node A. Consequently, the pre-determined function $R_d=f(S_{eq})$ is $R_d=V_{cs}/I_d$. Hence, this particular embodiment essentially employs a current comparison technique and the output of the comparator 420 is logically the indicating signal identifying an $R_j$ within the multi-level resistance set ($R_1$, $R_2$) that $R_d$ corresponds to. The controller 320, in this case a single feedback signal path, functions to either activate or deactivate the data driver 450 depending upon the correspondence, or not, between the indicating signal and the write-data.

The current comparison technique is further illustrated with a numerical example. Here the selected re-writable conductive memory device to be programmed is in the low resistive state with $R_d$ corresponds to $R_1$. When a write voltage $V_{wr}$ is initially applied to the cell $I_d$=40 $\mu$A before any resistance switching takes place The comparator 420 includes a reference current set at 20 $\mu$A, a similar load circuit for the reference current and the selected memory device and a voltage comparator. The load circuits are basically resistor networks connected to the voltage source $V_{cs}$. As the reference current is 20 $\mu$A and the selected memory device current is 40 $\mu$A, the voltage on node A will be lower than that on node B causing the output of the voltage comparator to be high. Notice that, instead, the comparator could be connected with a different polarity of input so that its output would be low. But this would not change the nature of this invention. In time, as the write voltage $V_{wr}$ starts to switch the resistance of the selected memory device, its current $I_d$ decreases from 40 $\mu$A until it reaches the reference current of 20 $\mu$A. At this point node A voltage equals node B voltage. As the programming of the selected memory device progresses further, node A voltage becomes higher than node B voltage that causes the voltage comparator to trip into a state of low output voltage. Hence, the voltage comparator output can be used to deactivate the data driver 450 thus turning off the write voltage $V_{wr}$ applied to the selected memory device.

On the other hand, if the selected memory device to be programmed is already in the high resistive state with $R_d$ corresponds to $R_2$ thus, for example, $I_d$=15 $\mu$A at start of the programming operation, the comparator output will stay low and the data driver will stay deactivated.

Notice that the above circuit needs to be properly initialized. If, at the beginning of the write cycle, the node A voltage starts at a value higher than the node B voltage, the output of the voltage comparator is low thus the data driver 450 stays disabled. The consequence is that the program operation would never start. To avoid this problem a discharge circuit and an initialization pulse can be used to force node A voltage low at the beginning of each program operation.

It is further remarked that, while only one reference current is needed in the above example for minimum functionality, this would not provide a more precise resolution of the actual resistance values $R_1$ and $R_2$. Thus, if so desired, additional reference current levels can be included in the adaptive programming circuitry to further improve the detection margin of the various resistance levels.

As already remarked before, the programming voltage pulse does not have to be a square pulse of constant amplitude. A further improvement would be to use a ramp on the programming voltage, starting at a low initial voltage value and increasing with time. The initial voltage can start somewhere at or above the read voltage and can go as high as the circuitry allows. For a cross point array, that means the voltage should not disturb unselected memory devices on the selected array lines. This technique, combined with the comparison technique, would insure that memory devices with a fast programming cycle time get programmed quickly at a relatively low voltage. On the other hand, memory devices with a slow programming cycle time can be programmed faster than if a constant voltage was applied as a write voltage. Furthermore, if a memory device has a very high write threshold voltage it may never program under a normal constant voltage drive. Here, by increasing the write voltage it is now possible to program this memory device. However, it may not be desirable to program all the memory devices of the array with the increased write voltage as this could prematurely wear out or even damage those memory devices easily programmable at lower voltage levels.

Figure 4B:
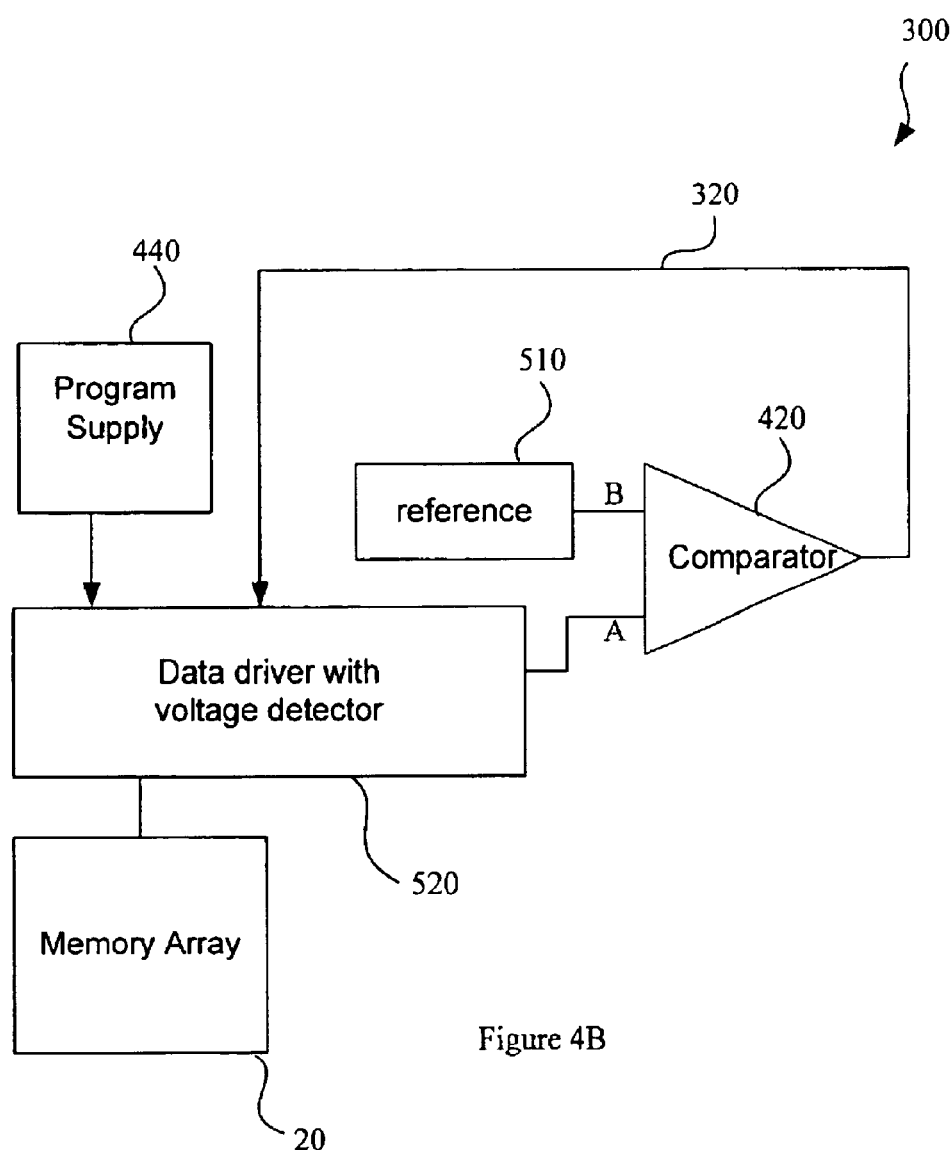
FIG. 4B depicts a second more detailed embodiment of the adaptive programming circuit using a comparator.

FIG. 4B depicts a second more detailed embodiment of the adaptive programming circuit 300 using a comparator. The multi-level resistance set $R_j$ still consists of only two distinct resistance levels $R_1 < R_2$, that is M=2. As part of the detector 310, the equivalent-reference signal set selector includes a reference data source 510 providing an equivalent-reference signal $REF_1$ at node B of a comparator 420. The driver 330 includes a program supply 440 and a data driver with voltage detector 520 outputting a detected re-writable conductive memory device voltage $V_d$ at node A. The program supply 440 outputs, inter alias, write-data. The data driver with voltage detector 520 includes a current source with an output current $I_{cs}$ for effecting an actual programming of the re-writable conductive memory device, located within a re-writable memory array 20, according to the write-data. Thus, the equivalent-signal $S_{eq}$ generator is the above voltage detector, coupled to the re-writable conductive memory device, providing the equivalent-signal $S_{eq}=V_d$, at node A. Hence, this particular embodiment essentially employs a voltage comparison technique and the output of the comparator 420 is logically the indicating signal identifying an $R_j$ within the multi-level resistance set ($R_1$, $R_2$) that $R_d$ corresponds to. The controller 320, in this case a single feedback signal path, functions to either activate or deactivate the data driver with voltage detector 520 depending upon the correspondence, or not, between the indicating signal and the write-data.

Figure 5:
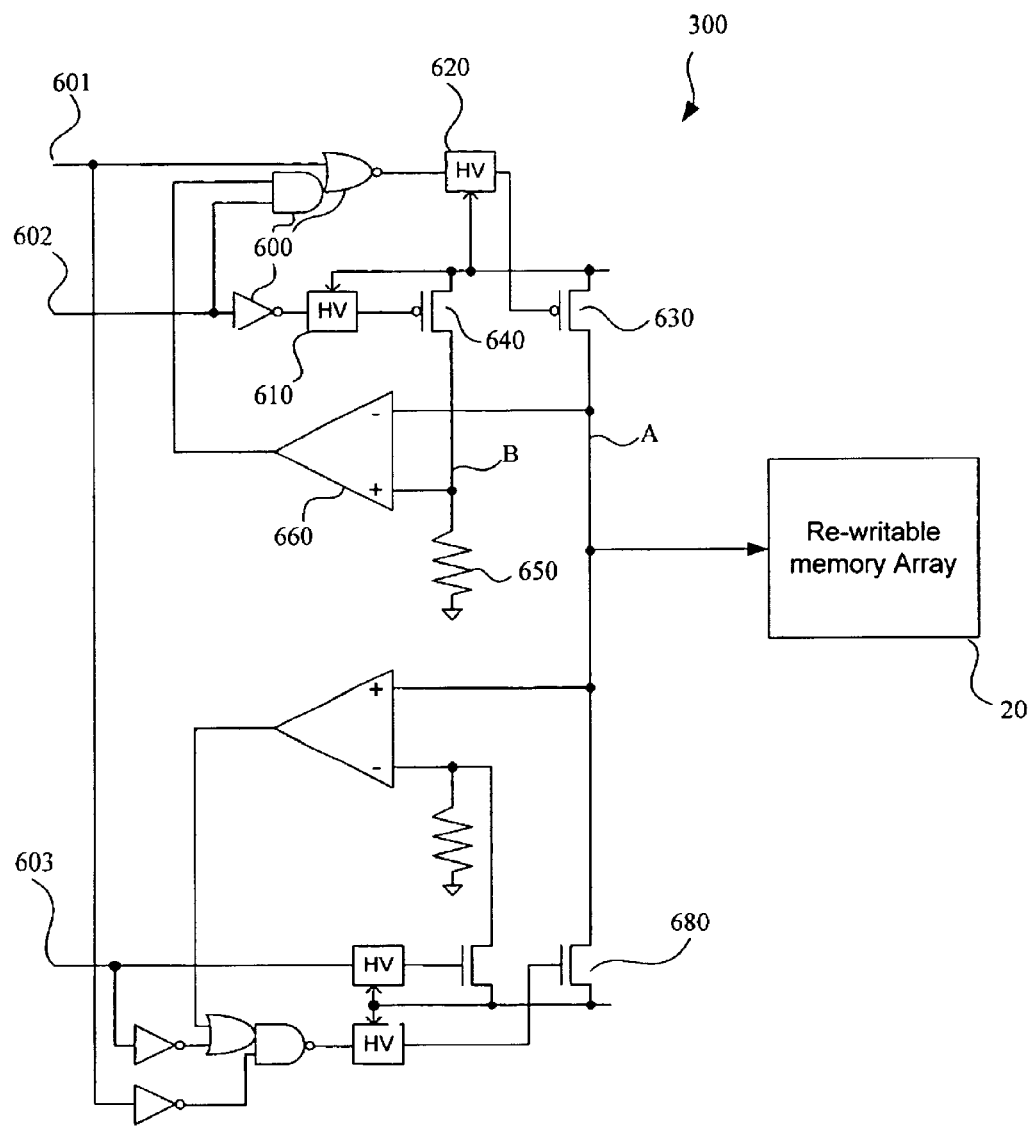
FIG. 5 depicts a third circuit schematic level embodiment of the adaptive programming circuit with a bipolar voltage drive, a current comparison circuitry and an activating logic.

FIG. 5 depicts a third circuit schematic level embodiment of the adaptive programming circuit 300 with a bipolar voltage drive, a current comparison circuitry and an activating logic. This circuit schematic uses 2 references so that the programmed resistance states $R_1$ and $R_2$ are separated by a pre-determined margin. Referring back to FIG. 2, to effect a reversible switching of $R_d$ between $R_1$ and $R_2$ ($R_1<R_2$) a bipolar voltage drive with at least a range of ($-VN_{c1}$, $+VP_{c1}$) is required. Correspondingly, the adaptive programming circuit 300 includes an upper half circuitry to provide the required positive voltage drive and a lower half circuitry, being essentially a mirror image of the upper half circuitry, to provide the required negative voltage drive. For convenience, the upper half circuitry is also called positive drive circuitry and the lower half circuitry is also called negative drive circuitry. While both the positive drive circuitry and the negative drive circuitry are logically driven by a write command pulse 601, the positive drive circuitry is only activated with a write-data $R_2$ signal 602 whereas the negative drive circuitry is only activated with a write-data $R_1$ signal 603. In this way, during a programming operation with a positive voltage drive the negative drive circuitry is deactivated in a state of high impedance to avoid any interference with the positive drive circuitry, and vice versa. Focusing on the details of the positive drive circuitry with further reference made to the earlier FIG. 3, the controller 320 includes an activating logic 600 in turn driving both a device pre-driver 620 and, through an $R_2$ reference pre-driver 610, an $R_2$ reference driver 640. The device pre-driver 620 drives a $+VP_{c1}$ device driver 630 whose output drives a selected re-writable conductive memory device within the re-writable memory array 20. In parallel, the $+VP_{c1}$ device driver 630 output, through a signal branch at node A, also feeds a negative terminal of a comparator 660. The $R_2$ reference driver 640 output, in combination with an $R_2$ reference resistance 650, establishes an equivalent-reference signal REF1 at node B that feeds a positive terminal of the comparator 660. Therefore, with its logic output fed into the activating logic 600, the comparator 660 would complete the desired function of adaptive programming between Point B and Point C of FIG. 2. Except for working in a domain of negative voltage with a $-VN_{c1}$ device driver 680, by now it should become clear that the negative drive circuitry has a similar circuit topology and functions, in a way similar to the positive drive circuitry above, to accomplish the desired function of adaptive programming between Point D and Point E of FIG. 2. It is also instructional to note that, while FIG. 5 depicts an embodiment with a bipolar voltage drive, there is nevertheless a typically small drain-to-source voltage drop across the $+VP_{c1}$ device driver 630 and the $-VN_{c1}$ device driver 680. Furthermore, the drain-to-source voltage drop itself is dependent upon the conductive memory device current $I_d$. Thus, the driving circuit can also be characterized as a hybrid combination of voltage and current source. Lastly, for those skilled in the art, the circuit topology of FIG. 5 is used for detecting $R_d$ between two levels separated by two reference levels in between to effect a higher detection resolution of $R_d$ with a correspondingly higher margin of correct logic decision.

Figure 6:
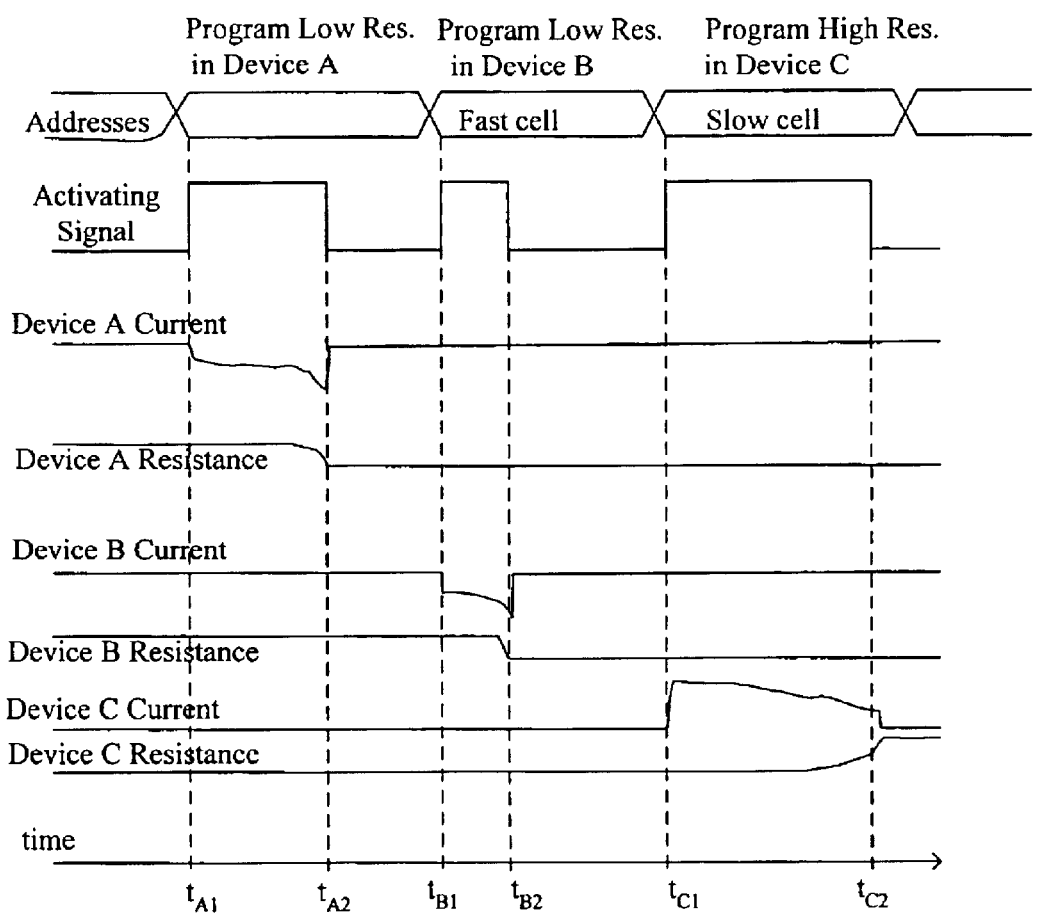
FIG. 6 depicts an exemplary timing diagram of signals and device currents during an application of the present invention in a re-writable memory array.

FIG. 6 depicts an exemplary timing diagram of signals and memory device currents during an application of the present invention in a re-writable memory array. In this example, a first device A within the re-writable memory array is programmed with a low resistance state, a second device B is programmed with a low resistance state and a third device C is programmed with a high resistance state. Notice the self-adapting nature of the activating signal having a variable pulse width each corresponds to an individual memory device being programmed. That is, device A exhibits a typical programming cycle time of $t_{A2}-t_{A1}$, cell B exhibits a fast programming cycle time of $t_{B2}-t_{B1}$ while cell C exhibits a slow programming cycle time of $t_{C2}-t_{C1}$.

Figure 7:
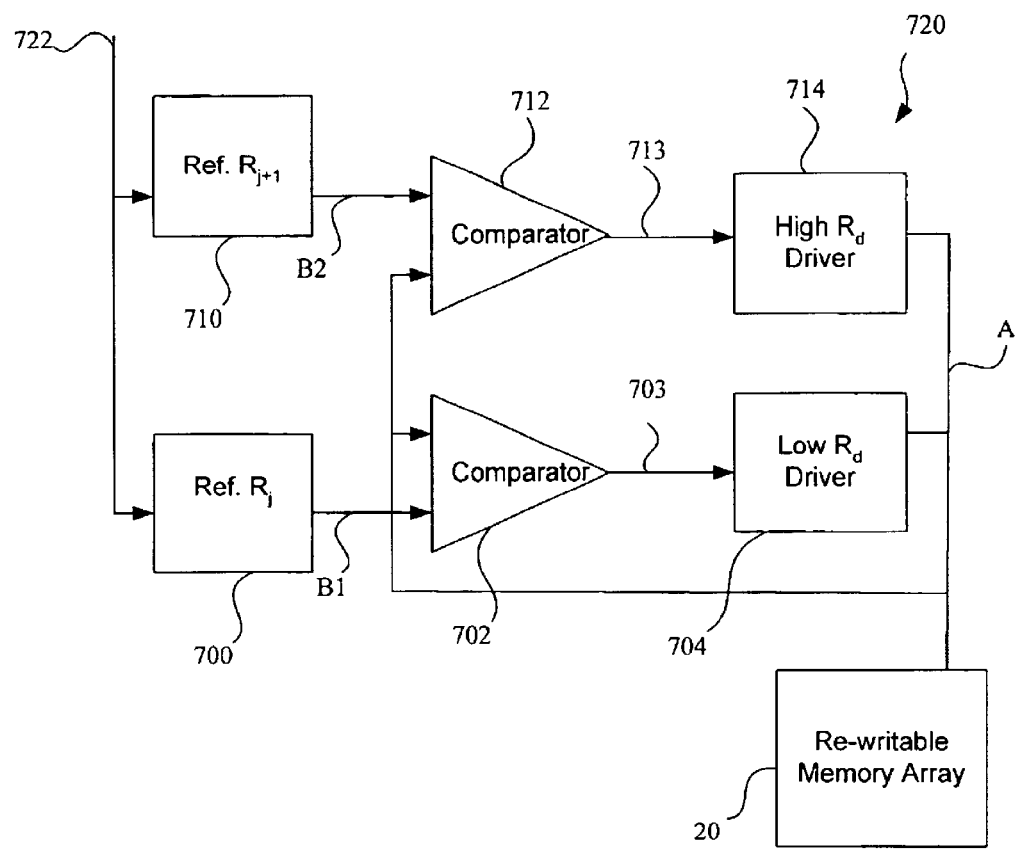
FIG. 7 illustrates another embodiment of the adaptive programming circuit extended to a general case where the re-writable conductive memory device exhibits a multi-level voltage switchable resistance set of more than two resistance levels.
Figure 8:
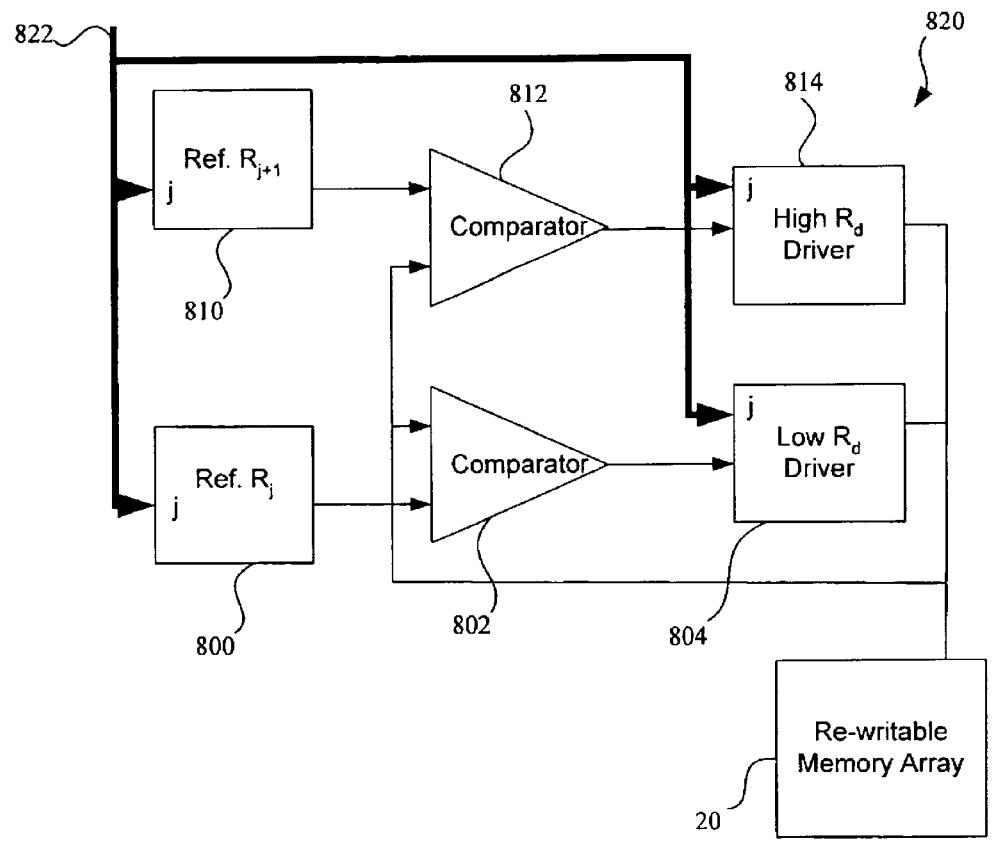
FIG. 8 illustrates yet another embodiment of the adaptive programming circuit extended to a general case where the re-writable conductive memory device exhibits a multi-level voltage switchable resistance set of more than two resistance levels.

FIG. 7 illustrates another embodiment of the adaptive programming circuit extended to a general case where the re-writable conductive memory device exhibits a multi-level voltage switchable resistance set of more than two resistance levels. To avoid unnecessary obscuring aspects of the present invention only section-j of adaptive programming circuit 720 is illustrated here where j=(1,2, . . . ,M−1), M>=3 and $R_1<R_2< \ldots <R_M$. However, it should be understood that all other sections are set in parallel, with a common connection at node A, with section-j. First of all, the entire section-j of adaptive programming circuit 720 is selected by a section-j selection signal 722. Upon selection, the section-j selection signal 722, for $R_j$ programming, activates a reference $R_j$ generator 700 to establish an equivalent-reference signal REFj at node B1 that feeds a first input terminal of a comparator 702. The output of the comparator 702, while in an activated state, in turn activates a low $R_d$ device driver 704 through a feedback signal path 703 to drive a selected re-writable conductive memory device within the re-writable memory array 20 causing a switching of $R_d$ into the $R_j$-state. In parallel, the low $R_d$ device driver 704 output, through a signal branch at node A, also feeds a second input terminal of the comparator 702 to complete the adaptive programming logic for resistance $R_j$. Similarly, the section-j selection signal 722, for $R_{j+1}$ programming, activates a reference $R_{j+1}$ generator 710 to establish an equivalent-reference signal REFj+1 at node B2 that feeds a first input terminal of a comparator 712. The output of the comparator 712, while in an activated state, in turn activates a high $R_d$ device driver 714 through a feedback signal path 713 to drive a selected re-writable conductive memory device within the re-writable memory array 20 causing a switching of $R_d$ into the $R_{j+1}$-state. In parallel, the high $R_d$ device driver 714 output, through the signal branch at node A, also feeds a second input terminal of the comparator 712 to complete the adaptive programming logic for resistance $R_{j+1}$. As an alternative embodiment to FIG. 7, FIG. 8 depicts a block diagram of an entire adaptive programming circuit 820 with the same functionality as FIG. 7 but a different implementation. The state-j selection signal 822, which tells the circuit which is the desired state out of M states, and includes typically k lines, so that $M=2^k$, can be applied to the two reference generators 800 and 810, and possibly also to the device drivers 804 and 814, to adjust these reference generators and device drivers so that their outputs equal to a respectively desired level appropriate for the state-j programming. Unlike FIG. 7, this approach requires only 2 comparators 802 and 812, 2 adjustable references 800 and 810 and 2 adjustable drivers 804 and 814. This is an advantage where no replication of the section-j circuit would be necessary to implement the programming of the multi-level resistance set ($R_1, R_2, \ldots R_M$).

Regardless of the detailed description of the various embodiments above, considering the simplicity of implementation, the front end of the circuit schematic as depicted in FIG. 5 is considered to be the best for practicing the present invention. Specifically, this front end circuit includes the device driver 630, the reference driver 640, the reference resistance 650 and the comparator 660.

As described, an adaptive programming technique for a re-writable conductive memory device is proposed to achieve a reliable re-writable conductive memory device programming with a short programming cycle time despite the tolerance of various memory device parameters affecting the programming cycle time. The invention has been described using exemplary preferred embodiments. However, for those skilled in this field, the preferred embodiments can be easily adapted and modified to suit additional applications without departing from the spirit and scope of this invention. For example, the driver can be generalized into a combination voltage and current drive with an arbitrary output waveform as long as it exceeds the respectively required threshold voltages for programming. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

We claim:

1. A program circuit for a programming a selected cell to a desired resistive state in a conductive re-writable memory comprising:
   a first reference input;
   a second reference input
   a selected cell input from the selected cell, the selected cell having a resistance, the resistance capable of representing stored information;
   a first comparator that is capable of producing a first comparator output that is a function of the selected cell input and the first reference input; and
   a second comparator that is capable of producing a second comparator output that is a function of the selected cell input and the second reference input.

2. The program circuit of claim 1, wherein the function of the first comparator is a direct comparison of the selected cell input and the first reference input.

3. The program circuit of claim 2, wherein the direct comparison is a comparison of:
   voltage from the selected cell input and voltage of the first reference input; or
   current from the selected cell input and current of the first reference input; or
   resistance from the selected cell input and resistance of the first reference input.

4. The program circuit of claim 2, wherein:
   the first comparator output causes the program circuit to cease programming when the selected cell input equals the first reference input.

5. The program circuit of claim 4, wherein:
   the resistance is capable of representing more than one bit of information.

6. The program circuit of claim 1, wherein:
   the programming of the selected cell is dependent upon either the first comparator output or the second comparator output, depending on the desired state to be programmed into the selected cell.

7. The program circuit of claim 6, wherein:
   if the programming of the selected cell is dependent upon the first comparator output, the first comparator output can cause the programming circuit to cease programming; and
   if the programming of the selected cell is dependent upon the second comparator output, the second comparator output can cause the programming circuit to cease programming.

8. The program circuit of claim 7, wherein:
   the first comparator output causes the program circuit to cease programming when the selected cell input is equivalent to the first reference input; and
   the second comparator output causes the program circuit to cease programming when the selected cell input is equivalent to the second reference input.

9. The program circuit of claim 1, further comprising:
   a first load circuit coupled to the selected cell;
   a second load circuit that receives the first reference input;
   a third load circuit that receives the second reference input;
   wherein the first, second and third load circuits have essentially the same load characteristics.

10. The program circuit of claim 1, wherein:
    the first comparator and the second comparator are voltage comparators.

11. The program circuit of claim 1, wherein:
    the first comparator output and the second comparator output are combined, the programming of the selected cell being dependent upon the combination.

12. The program circuit of claim 1, wherein:
    the first and second comparator outputs are bypassed during an initialization step.

13. An adaptive programming circuit for, upon detection of a write command, programming a voltage switchable re-writable conductive memory device of resistance $R_d$ to correspond to a write-data signal, comprising:
    a detecting means, coupled to the re-writable conductive memory device, for detecting $R_d$ and outputting a signal that is dependent on $R_d$;
    a control means, coupled to the detecting means, for detecting the write command and, based upon the output of the detecting means, generating an activating signal indicating either an activated or a deactivated state; and
    a driving means, coupled to the re-writable conductive memory device and the control means, for driving, only while said activating signal is in the activated state, the re-writable conductive memory device such that the resistance of the conductive memory device is increased or decreased, depending upon the write-data signal.

14. An adaptive programming circuit for, upon detection of a write command, programming a voltage switchable re-writable conductive memory device of resistance $R_d$ to a target resistance $R_t$ corresponding to a write-data signal comprising:
    a detector, coupled to the re-writable conductive memory device, for detecting $R_d$ and outputting a detector output that is a function of $R_d$;

a controller, coupled to the detector, for detecting the write command and, based upon the detector output, generating an activating signal indicating either an activated or a deactivated state; and a driver, coupled to the re-writable conductive memory device and the controller, for driving, only while said activating signal is in the activated state, the re-writable conductive memory device such that the resistance of the conductive memory device is increased or decreased to $R_t$ depending upon the write-data signal, whereby $R_t$ is already equal to $R_d$ when the activating signal is in the deactivated state while the write command is detected.

15. The adaptive programming circuit of claim 14, wherein:
the detector output is a additionally a function of a reference input.

16. The adaptive programming circuit of claim 14, wherein:
the driver stops driving the re-writeable conductive memory device after a specified pulse time.

17. The adaptive programming circuit of claim 16, wherein:
if the re-writeable conductive memory device does not achieve the $R_t$ resistance within the specified pulse time, a fault signal is set.

18. The adaptive programming circuit of claim 14, wherein:
the re-writable conductive memory has a threshold voltage, below which the resistance will not appreciably change; and
the driver delivers a voltage that ramps up to the threshold voltage.

19. The adaptive programming circuit of claim 18, wherein:
the driver delivers a voltage that continues to ramp up past the threshold voltage.

20. The adaptive programming circuit of claim 18, wherein:
the driver delivers a voltage that begins at or near a read voltage.

21. The adaptive programming circuit of claim 18, wherein:
the detector is further operable to determine the re-writable conductive memory device's state.

22. The adaptive programming circuit of claim 14 wherein said programming cycle time is from about 0.1 ns to about 100 ms.

23. The adaptive programming circuit of claim 14 wherein said re-writable conductive memory device is of a conductive metal oxide type of device.

24. A re-writable memory comprising:
an array of re-writable memory cells, each memory cell capable of being in a high current state and a low current state;
selection circuitry that is capable of selecting at least one memory cell out of the array of memory cells such that the at least one selected cell passes current;
a high reference current;
a low reference current that is lower than the high reference current;
a comparator that is capable of producing a comparator output that is a function of the at least one selected cell current and one of the reference currents,
a driver that programs the at least one selected cell to the high current state as a function of the comparator output and the high reference current and programs the at least one selected cell to the low current state as a function of the comparator output and the low reference current.

25. The re-writable memory of claim 24, wherein:
the driver delivers a voltage that begins at a read voltage, and
the comparator is capable of producing a comparator output that is representative of the state of the selected at least one memory cell,
whereby the comparator is used during read and write operations.

26. A self terminating programming process for programming a voltage swichable re-writable conductive memory device of resistance $R_d$, comprising:
receiving a write command for a target resistance $R_t$;
selecting a reference current, the selection being dependent upon $R_t$;
detecting a memory cell current, the memory cell current being based upon $R_d$;
comparing the selected reference current with the memory cell current;
applying a write voltage across the memory cell for as long as the comparison indicates that $R_t$ is not equal to $R_d$; and
terminating the programming cycle when $R_t$ is equal to $R_d$.

27. A program circuit for a programming a selected cell to a desired resistive state in a conductive re-writable memory comprising:
a first reference input;
a second reference input;
a selected cell input from the selected cell, the selected cell having a resistance, the resistance capable of representing stored information;
a first comparator that is capable of producing a first comparator output that is a function of the selected cell input and the first reference input;
a second comparator that is capable of producing a second comparator output that is a function of the selected cell input and the second reference input;
a first driver that drives the selected cell to a first resistive state when the first resistive state is the desired resistive state, the first driver being at least partially dependent upon the first comparator output for its activation; and
a second driver that drives the selected cell to a second resistive state when the second resistive state is the desired resistive state, the second driver being at least partially dependent upon the second comparator output for its activation.

28. The program circuit of claim 27 further comprising:
a third reference input;
a third comparator that is capable of producing a third comparator output that is a function of the selected cell input and the third reference input; and
a third driver that drives the selected cell to a third resistive state when the third resistive state is the desired resistive state, the third driver being at least partially dependent upon the third comparator output for its activation.

29. The program circuit of claim 28 wherein:
the second reference input can have multiple values depending upon the desired resistive state.

30. The program circuit of claim 27 wherein:
the first reference input can have multiple values depending upon the desired resistive state.

31. A program circuit for a programming a selected cell to a desired resistive state in a re-writable conductive memory comprising:
- at least one reference level;
- a selected cell level from the selected cell, the selected cell having a resistance, the resistance capable of representing stored information;
- at least one comparator that is capable of producing an at least one comparator output that is a function of the selected cell level and the at least one reference level;
- a first driver to provide a voltage capable of increasing the resistance of the selected cell;
- a second driver to provide a voltage capable of decreasing the resistance of the selected cell;
- wherein the first or second driver is activated depending on the at least one comparator output and the desired resistive state.

32. The program circuit of claim 31, wherein the at least one reference level and the selected cell level are current levels.

33. The program circuit of claim 31, wherein the at least one reference level and the selected cell level are voltage levels.

34. The program circuit of claim 31, wherein the at least one reference level and the selected cell level are resistance levels.

35. The program circuit of claim 31, wherein there are $2^+(N-1)$ reference levels for N desired resistive states.

36. The program circuit of claim 31, wherein there are $N-1$ reference levels for N desired resistive states.

37. The program circuit of claim 31, wherein the first driver and the second driver share at least some of the same circuitry.

* * * * *